(12) United States Patent
Inoue

(10) Patent No.: US 6,284,624 B1
(45) Date of Patent: Sep. 4, 2001

(54) SEMICONDUCTOR DEVICE AND METHOD OF MANUFACTURING THE SAME

(75) Inventor: Masao Inoue, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/337,267

(22) Filed: Jun. 22, 1999

(30) Foreign Application Priority Data

Jan. 6, 1999 (JP) .................................................. 11-000996

(51) Int. Cl.$^7$ ..................................................... H01L 21/76
(52) U.S. Cl. ........................... 438/425; 438/435; 438/437
(58) Field of Search ..................................... 438/424, 425, 438/426, 427, 428, 430, 431, 435, 436, 437

(56) References Cited

U.S. PATENT DOCUMENTS

| 5,731,221 | * | 3/1998 | Kwon ................................. 438/426 |
| 5,786,263 | * | 7/1998 | Perera ................................ 438/431 |
| 6,001,706 | * | 12/1999 | Tan et al. ........................... 438/424 |

FOREIGN PATENT DOCUMENTS 57-1138   1/1982 (JP) .
59-214238 12/1984 (JP) .

OTHER PUBLICATIONS

"A New Simple and Reliable Method to Form a Textured Si Surface for the Fabrication of a Tunnel Oxide Film", by Kow–Ming Chang et al., IEEE Electron Device Letters, vol. 19, No. 5, May 1998, pp. 145–147.

* cited by examiner

Primary Examiner—Stephen D. Meier
Assistant Examiner—Jeff Vockrodt
(74) Attorney, Agent, or Firm—McDermott, Will & Emery

(57) ABSTRACT

A polycrystalline silicon film is formed on a surface of a trench and on a surface of a silicon nitride film. A silicon substrate covered with a polycrystalline silicon film is thermally oxidized at 900 to 1100° C. in an oxygen ambient to provide an uneven interface between a thermally oxidized silicon film and the silicon substrate. Thus a semiconductor device can be obtained capable of reducing a compressive stress caused in the semiconductor substrate near an element isolating trench region to minimize formation of crystal defect.

6 Claims, 18 Drawing Sheets

SEMICONDUCTOR DEVICE AND METHOD OF MANUFACTURING THE SAME

BACKGROUND OF THE INVENTION

1. Field of the Invention

The present invention relates to semiconductor devices and methods of manufacturing the same and in particular to semiconductor devices with an element isolating trench region wherein compressive stress of the semiconductor substrate can be alleviated in a vicinity of the trench.

2. Description of the Background Art

A conventional semiconductor device manufacturing method and a semiconductor device obtained in accordance with the manufacturing method will now be described with reference to the drawings. Referring first to FIG. 26, thermal oxidation or the like is used to form a silicon oxide film 102 on a silicon substrate 101. Chemical vapor deposition (CVD) or the like is used to form a silicon nitride film 103 on silicon oxide film 102.

Referring then to FIG. 27, patterned photoresist (not shown) is provided on silicon nitride film 103. The patterned photoresist is used as a mask to anisotropically etch silicon nitride film 103 and silicon oxide film 102 to expose a surface of silicon substrate 101. The exposed silicon substrate 101 is further etched anisotropically to form a trench 104 of 3000 to 5000 Å in depth.

Referring now to FIG. 28, silicon substrate 101 is oxidized, e.g., at a temperature of 1100° C. in an oxygen ambient to form a silicon oxide film 105 on the silicon substrate 101 surface exposed in trench 104. Referring then to FIG. 29, a Tetra Ethyl Ortho Silicate glass (TEOS)-based silicon oxide film 106 or the like is formed on silicon nitride film 103 to fill trench 104. Referring then to FIG. 30, chemical mechanical polishing (CMP) process or the like is applied to silicon oxide film 106 to leave silicon oxide film 106 only in trench 104.

Referring then to FIG. 31, an aqueous solution of phosphoric acid or the like is used to remove silicon nitride film 103. Referring then to FIG. 32, an aqueous solution of hydrofluoric acid or the like is used to etch silicon oxide film 102 to expose a surface of silicon substrate 101. Thus an element isolating region A completes.

Referring now to FIG. 33, thermal oxidation is used to form a silicon oxide film 107 for forming a gate oxide film on silicon substrate 101. Referring then to FIG. 34, a polysilicon film or the like (not shown) is formed on silicon oxide film 107. Photolithography and etching are then used to form a gate electrode 109 on silicon substrate 101 with a gate oxide film 107a posed therebetween.

A sidewall insulating film 110 is formed on each of both side surfaces of gate electrode 109. Gate electrode 109 and sidewall insulating film 110 are used as a mask to introduce impurity ions of a predetermined conduction type into a main surface of silicon substrate 101 to form source/drain regions 108a, 108b there. Thus a MOS transistor 112 is formed in an element forming region B. To cover MOS transistor 112, chemical vapor deposition is used to form a silicon oxide film 111 on silicon substrate 101.

Thus a main portion of a semiconductor device provided with MOS transistor 112 completes in element forming region B electrically isolated from other regions by element isolating region A In accordance with the semiconductor device manufacturing method described above, in the FIG. 28 step a thermal process is performed to form silicon oxide film 105 on a surface of silicon substrate 101 exposed in trench 104 to electrically isolate the silicon substrate 101 surface exposed in trench 104 and a portion in a vicinity thereof that are damaged by the anisotropical etch performed in forming trench 104.

Furthermore, in the FIG. 33 step the thermal oxidation or the like used to form silicon oxide film 107 also oxidizes a portion of silicon substrate 101 located at an upper portion in trench 104.

When silicon oxide film 105, 107 or the like is grown, however, compressive stress is exerted in silicon substrate 101 substantially parallel to an interface of silicon substrate 101 and the silicon oxide film. The compressive stress is relatively intense particularly at regions S1, S2 shown in FIG. 35 and a disadvantageous crystalline defect readily results in silicon substrate 101 at regions S1, S2.

Thus, when a MOS transistor or the like is formed in element forming region B, the crystalline defect resulting in region S1 can degrade the reliability of the gate oxide film thereof and current leakage can be caused between the source/drain regions and the silicon substrate. The crystalline defect caused in region S2 can also reduce the breakdown voltage between adjacent, element forming regions Bs.

SUMMARY OF THE INVENTION

The present invention has been made to overcome the disadvantages described above. One object of the present invention is to provide a semiconductor device reducing a compressive stress caused in a semiconductor substrate in a vicinity of an element isolating trench region to reduce formation of a crystalline defect. Another object of the present invention is to provide a method of manufacturing such a semiconductor device.

A semiconductor device manufacturing method in one aspect of the present invention is that for forming an element isolating trench region electrically isolating an element forming region formed at a main surface of a semiconductor substrate from another element forming region formed at the main surface of the semiconductor substrate, including the steps of forming a trench in a main surface of the semiconductor substrate, and subjecting a surface of the semiconductor substrate located in the trench to a first thermal oxidation process to form a first oxide film and also partially enhancing the thermal oxidation of the semiconductor substrate surface associated with the first thermal oxidation process to provide an uneven interface between the first oxide film and the semiconductor substrate.

In accordance with the manufacturing method, that portion of a surface of a semiconductor substrate located in a trench at which thermal oxidation is enhanced is oxidized more deeply into the semiconductor substrate than other portions are oxidized. Thus the first oxide film formed on the surface of the semiconductor substrate located in the trench has a portion formed relatively deeper as measured from the surface than other portions and the first oxide film and the semiconductor substrate thus have an uneven interface therebetween. A microscopic compressive stress caused in the semiconductor substrate is exerted along the interface of the semiconductor substrate and the first oxide film. Thus when the interface is uneven the microscopic compressive stress will not be directed in one direction. Thus a net compressive stress (or macroscopic compressive stress) caused in the semiconductor substrate is smaller than when the microscopic compressive stress is directed in one direction. This reduces formation of a crystalline defect in regions of the semiconductor substrate at which intensive compressive stress is particularly readily exerted, i.e., regions of the semiconductor substrate near the bottom and opening of the trench.

Preferably the interface forming step of providing the uneven interface includes the steps of forming a layer having a grain boundary on a surface of the semiconductor substrate exposed in the trench, and subjecting the layer having the grain boundary to a first thermal oxidation process.

Thus, oxidation can be promoted more in the portion of the grain boundary of the grain boundary containing layer than in other portions to enhance the oxidation of the portion of the semiconductor substrate located under the grain boundary. Thus, an uneven interface of the first oxide film and the semiconductor substrate can readily be formed.

Still preferably, the grain boundary containing layer is a polycrystalline silicon film having a film thickness of 50 to 500 Å.

With a polycrystalline silicon film having a film thickness of less than 50 Å, it is difficult to partially enhance the oxidation of the semiconductor substrate through grain boundary of the polycrystalline silicon film and the interface cannot have sufficient unevenness. With a polycrystalline silicon film having a film thickness exceeding 500 Å, it takes long time to oxidize the polycrystalline silicon film and also form the polycrystalline silicon film itself. It is also difficult to fill the trench with an insulating film or the like in a subsequent step, since the aspect ratio is increased. Thus in view of obtaining the interface with appropriate unevenness and manufacturing the semiconductor device, a polycrystalline silicon film having a film thickness of 50 to 500 Å is more preferable as the grain boundary containing layer.

Preferably the interface forming step includes the step of forming the first oxide film containing that portion of the semiconductor substrate which is damaged when the trench is formed.

In the semiconductor substrate, a crystal defect is also caused when the substrate is damaged in etching the trench. The first oxide film formed to contain such a damaged portion enhances the electrical insulation between adjacent, element forming regions.

Still preferably, the interface forming step is followed by the steps of removing the first oxide film to expose an uneven surface of the semiconductor substrate in the trench, and subjecting the uneven surface of the semiconductor substrate to a second thermal oxidation process to form a second oxide film.

The entirety of the second oxide film is formed by thermally oxidizing the semiconductor substrate. The second oxide film thus formed is a dense film and is superior in dielectric strength and in the electrical insulation between adjacent, element forming regions, e.g., to an oxide film formed by thermally oxidizing a polycrystalline silicon film.

Still preferably, the interface forming step is followed by the steps of forming an insulating film on the semiconductor substrate to fill the trench and polishing the insulating film to leave the insulating film in the trench, and before forming the trench is provided the step of forming on a main surface of the semiconductor substrate a first film having a polishing property different from that of the insulating film.

In polishing the insulating film, the first film can serve as a stopper to stop the polishing process to readily terminate the polishing process when the first film is exposed.

Still preferably, before forming the trench is provided the step of forming a second film provided between the first film and a main surface of the semiconductor substrate and changed into an oxide film through thermal oxidation, and the interface forming step is followed by the step of removing the first film and also removing the second oxide film left unoxidized through the first or second thermal oxidation process while leaving the second film oxidized in a vicinity of an opening end of the trench through the first or second thermal oxidation process.

The portion of the second film oxidized in a vicinity of the opening end of the trench can prevent the vicinity of the trench's opening end from being excessively etched in a subsequent step, e.g., in performing an etching process to expose a surface of the semiconductor substrate.

A semiconductor device in another aspect of the present invention is that provided with an element isolating trench region for electrically isolating an element forming region formed at a main surface of a semiconductor substrate from another formed at the main surface of the semiconductor substrate. The element isolating trench region has a trench formed in a main surface of the semiconductor substrate and an insulating film formed on a surface of the trench, and an interface between the semiconductor substrate and the insulating film is uneven.

This structure is obtained in accordance with a semiconductor device manufacturing method in one aspect of the present invention. Oxidation is provided more deeply into the semiconductor substrate at that surface of the semiconductor substrate located in the trench which is subjected to enhanced thermal oxidation than at other portions so as to provide an uneven interface between an oxide film and the semiconductor substrate. Thus a microscopic compressive stress caused in the semiconductor substrate is not directed in a single direction and a net compressive stress (or macroscopic compressive stress) is reduced As a result, the present semiconductor device has less crystalline defect caused in a region particularly readily subjected to intensive compressive stress, i.e., that region of the semiconductor substrate located near the bottom and opening end of the trench.

Preferably, the insulating film includes an oxide film formed by thermally oxidizing the semiconductor substrate.

In this example the oxide film is more dense and further enhances the electrical insulating property of the insulating film.

Still preferably, the insulating film is formed to contain a portion damaged when the trench is formed.

In the semiconductor substrate, a portion damaged in etching the substrate to form the trench has a crystalline defect. The insulating film formed to contain such a damaged portion further enhances the electrical insulation between adjacent, element forming regions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
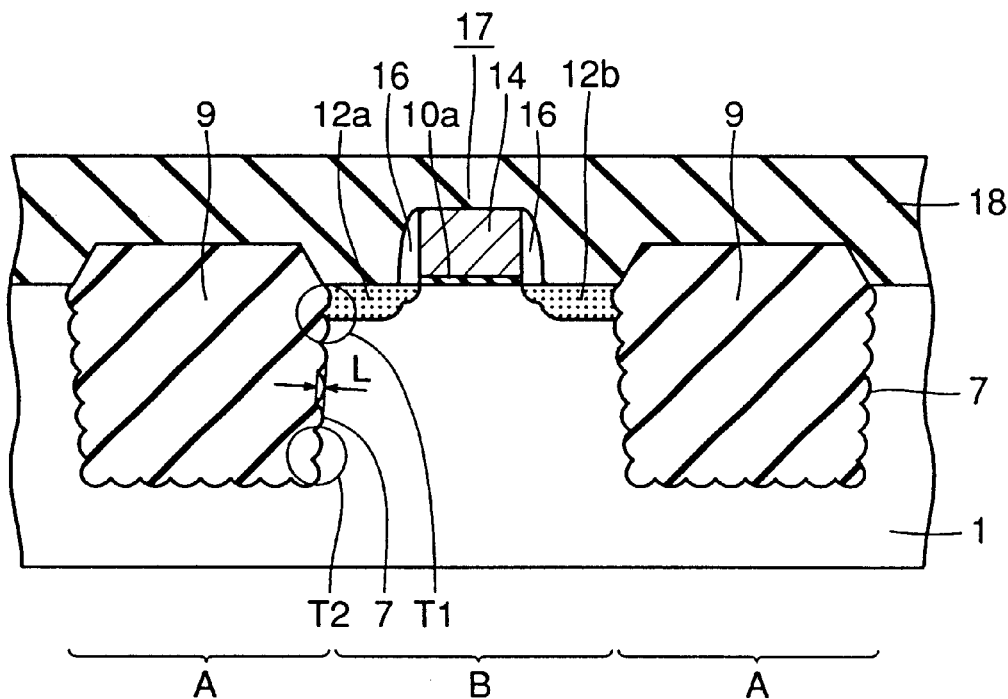
FIG. 1 is a cross section of a semiconductor device according to a first embodiment of the present invention.

A semiconductor device according to a first embodiment of the present invention will now be described with reference to the drawings. Referring to FIG. 1, an element forming region B electrically isolated from other regions by an element isolating trench region A is formed at a main surface of a silicon substrate 1. In element forming region B, a gate electrode 14 is formed on a main surface of silicon substrate 1, with a gate oxide film 10a posed therebetween. A sidewall insulating film 16 is formed on each of both side surfaces of gate electrode 14.

Source/drain regions 12a, 12b are formed in silicon substrate 1 such that source/drain regions 12a, 12b sandwich gate electrode 14 at its both sides. One MOS transistor 17 is constructed, including gate electrode 14 and source/drain regions 12a, 12b. MOS transistor 17 is covered by a silicon oxide film 18 formed on silicon substrate 1. Thus a main portion of the semiconductor device according to the present embodiment is configured as described above.

In the semiconductor device described above, an element isolating oxide film 9 of element isolating trench region A and silicon substrate 1 has an uneven interface 7 therebetween. The unevenness has a size L of approximately 5 to 20 Å. The uneven interface 7 can reduce formation of crystalline defects in silicon substrate 1, as will be described hereinafter. In particular, formation of crystalline defect can be reduced in silicon substrate 1 at a region T1 to minimize degradation of the reliability of the gate oxide film and reduce current leakage between source/drain regions 12a, 12b and silicon substrate 1. Crystalline defect can also be reduced in silicon substrate 1 at a region T2 to minimize degradation of the electrical insulation between adjacent, element forming regions Bs.

Second Embodiment

Figure 2:
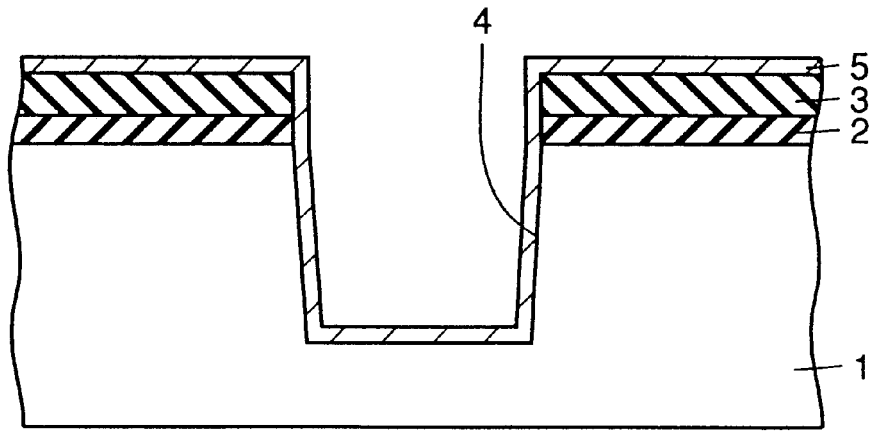
FIG. 2 is a cross section showing a process step of a semiconductor device manufacturing method according to a second embodiment of the present invention.
Figure 27:
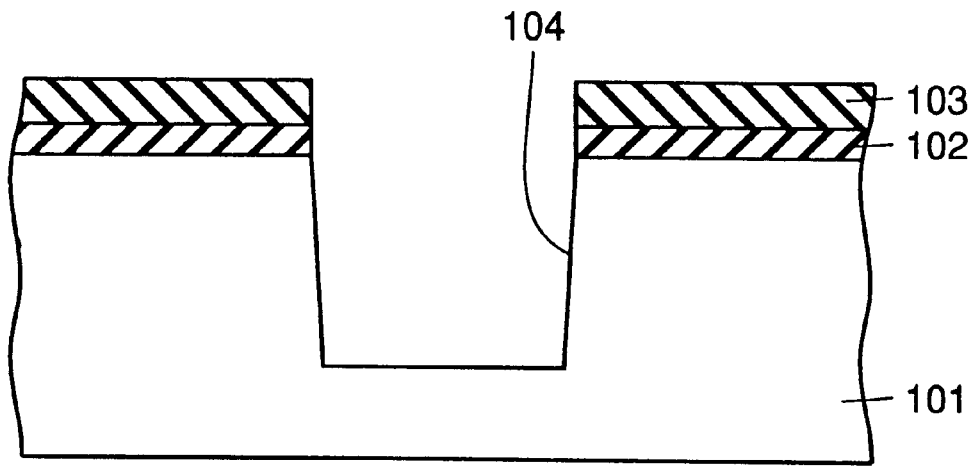
FIGS. 27–34 are cross sections showing a series of process steps, each step performed after the step shown in the immediately preceding figure.
Figure 28:
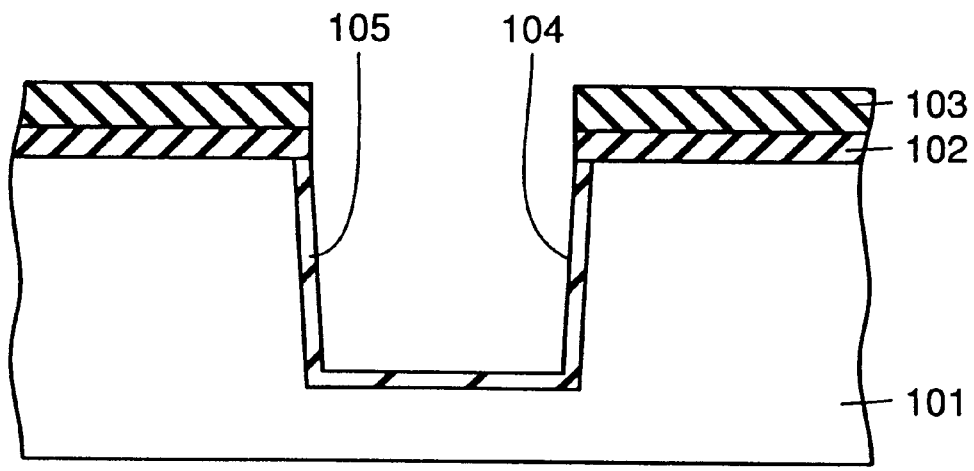
Figure 29:
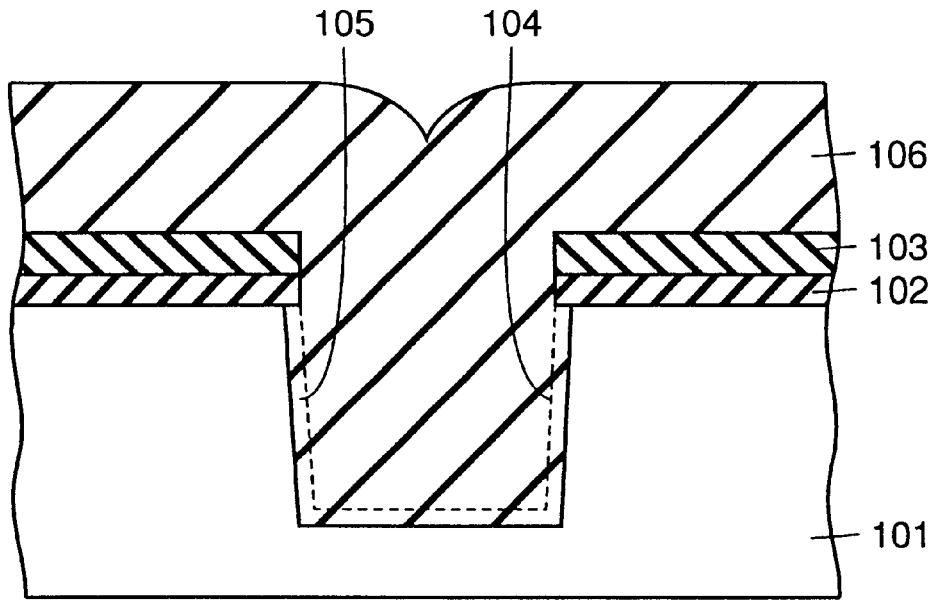
Figure 30:
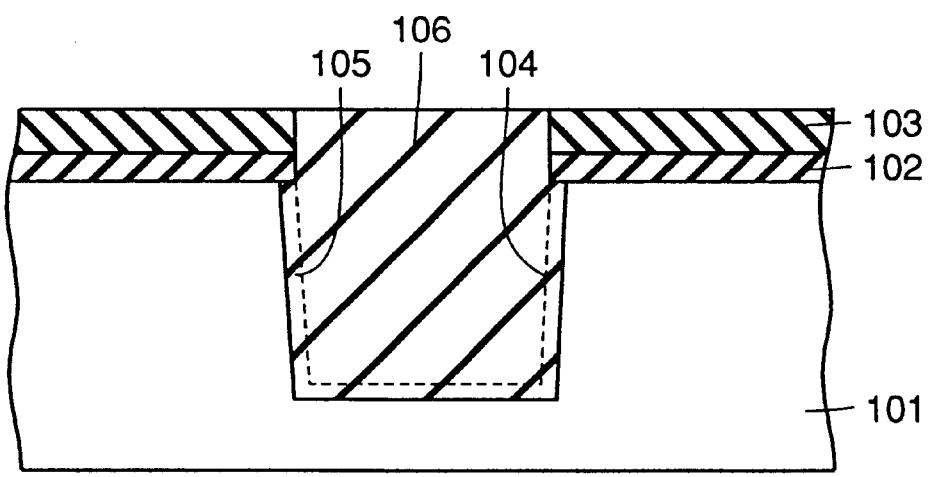
Figure 31:
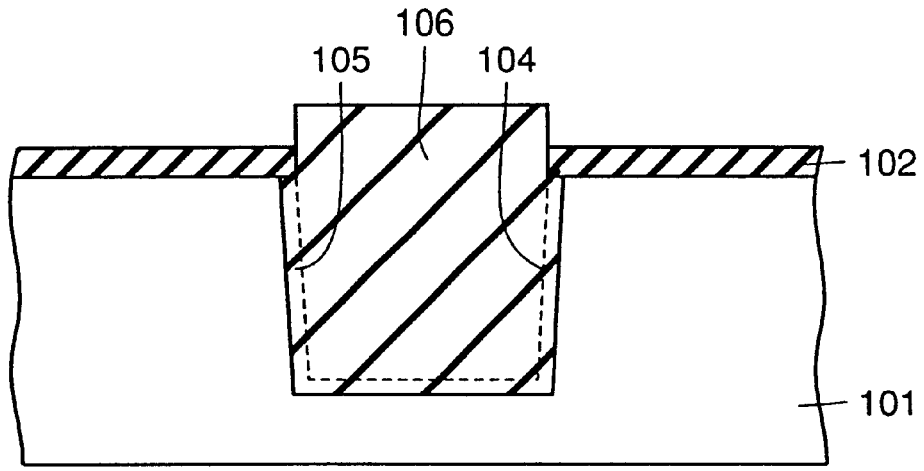
Figure 32:
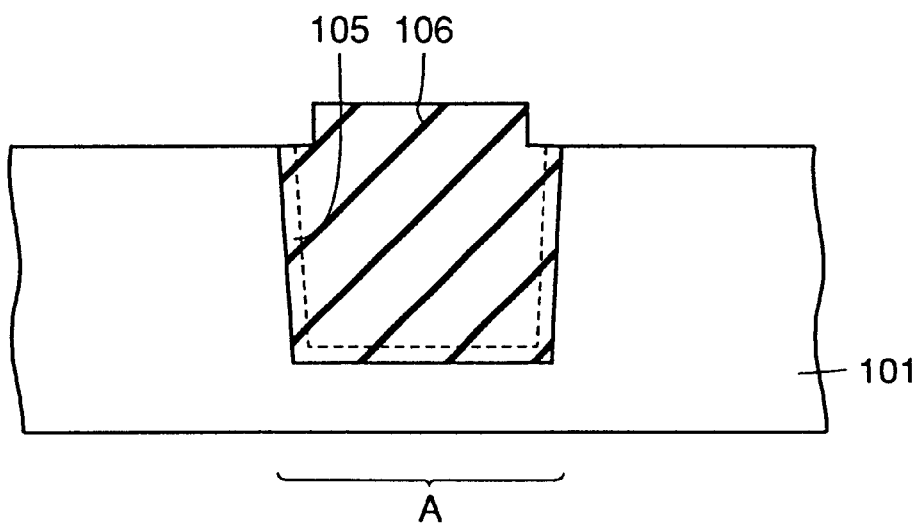
Figure 33:
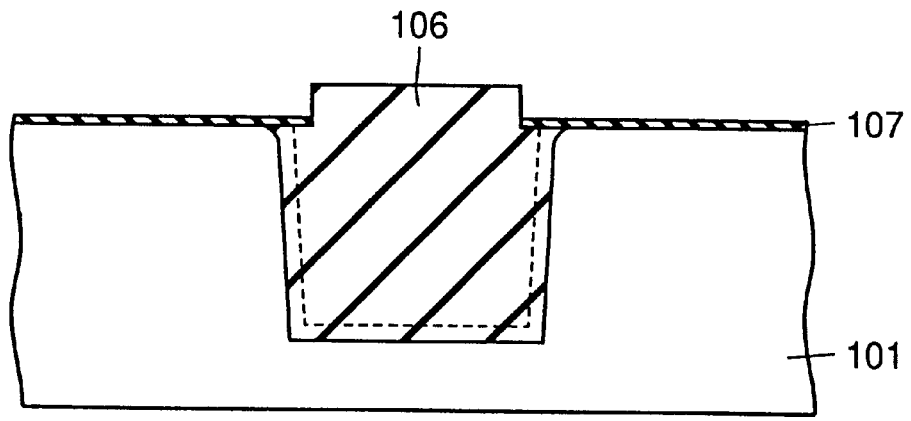

In the second embodiment, an exemplary method of manufacturing the semiconductor device described in the first embodiment will be described with reference to the drawings. Initially, the FIG. 27 step described in the Description of the Background Art is performed. Then, referring to FIG. 2, chemical vapor deposition is employed to form a polycrystalline silicon film 5 on a surface of a trench 4 and a surface of a silicon nitride film 3. Preferably, polycrystalline silicon film 5 has a film thickness of 50 to 500 Å.

Figure 3:
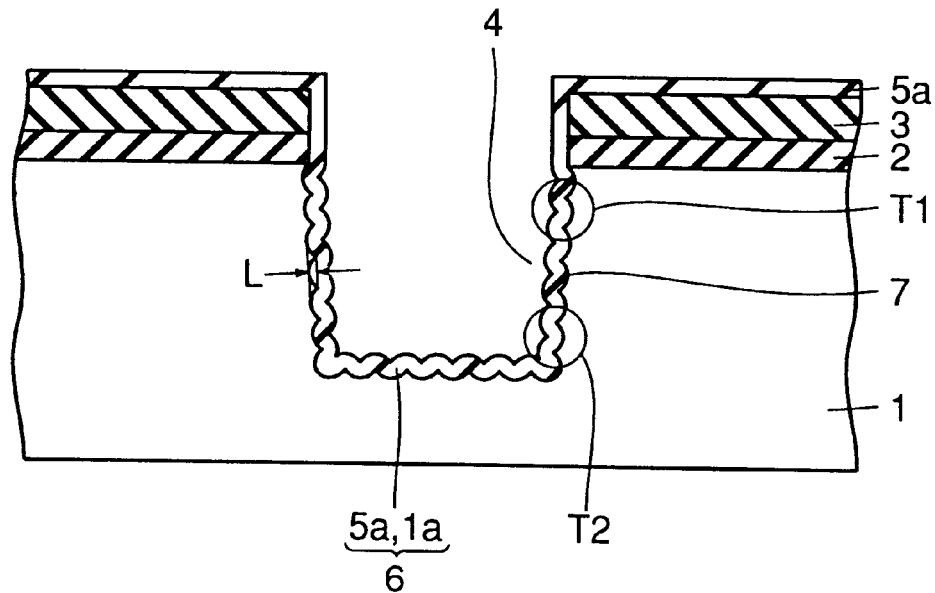
FIGS. 3–9 are cross sections showing a series of process steps of the semiconductor device manufacturing method according to the second embodiment of the present invention, each step performed after the step shown in the immediately preceding figure.

Referring now to FIG. 3, thermal oxidation is performed, e.g., at a temperature of 900 to 1100° C. in an oxygen ambient. The terminal oxidation allows polycrystalline silicon film 5 to be oxidized to provide a silicon oxide film 5a. The thermal oxidation further proceeds and a surface of silicon substrate 1 located under polycrystalline silicon film 5 is also oxidized to form a silicon oxide film 1a. As will be described hereinafter, a thermally oxidized silicon film 6 including silicon oxide films 5a, 1a and silicon substrate 1 has an uneven interface therebetween.

The fact that a silicon substrate covered with polycrystalline silicon film that is thermally oxidized has an uneven interface is described in K-M Chang et al, "A New Simple and Reliable Method to Form a Textured Si Surface for the Fabrication of a Tunnel Oxide Film" IEEE Electron Device Lett., vol. 19, p. 145, May 1998.

Figure 4:
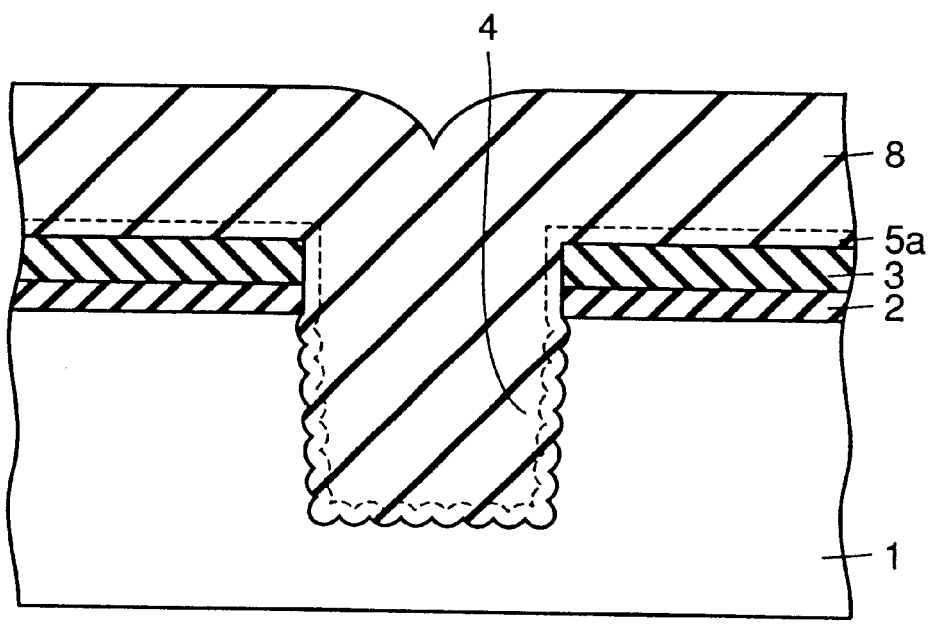
Figure 5:
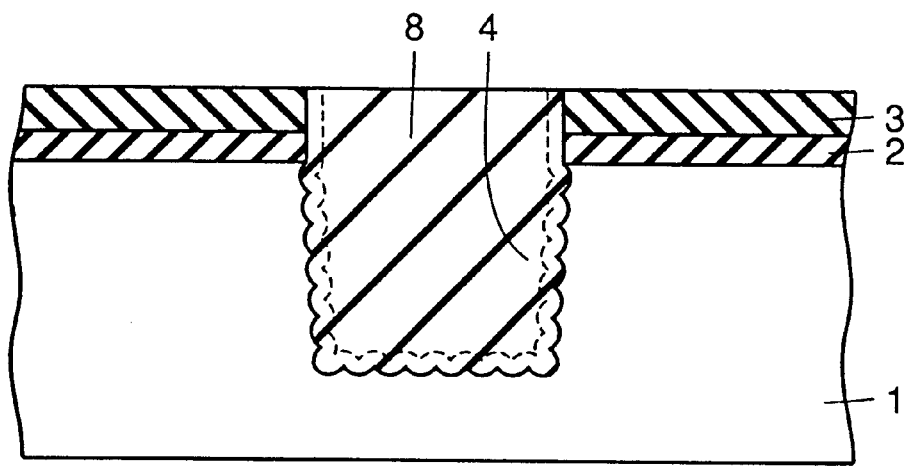

Referring now to FIG. 4, a TEOS-based silicon oxide film 8 or the like is formed such that it fills trench 4. Referring then to FIG. 5, silicon oxide film 8 is chemically mechanically polished to remove silicon oxide film 8 on silicon nitride film 3 to leave silicon oxide film 8 only in trench 4. Silicon nitride film 3 is different in polishing property from silicon oxide film 8, serving as a stopper film to end the chemical and mechanical polishing.

Figure 6:
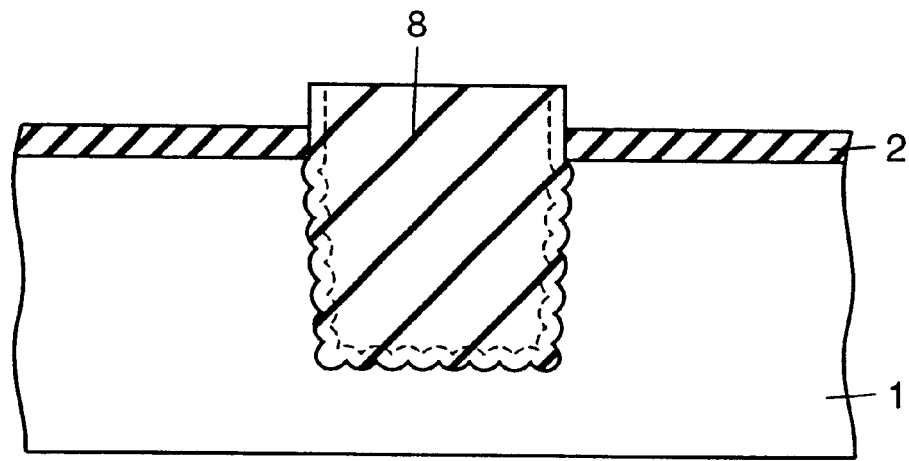
Figure 7:
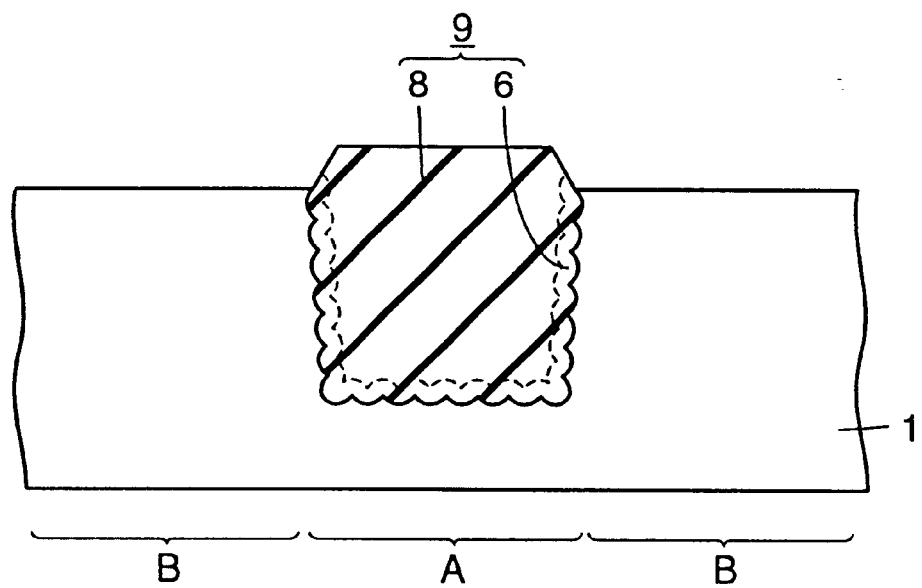

Referring now to FIG. 6, an aqueous solution of phosphoric acid or the like is used to remove silicon nitride film 3. Referring then to FIG. 7, an aqueous solution of hydrofluoric acid or the like is used to etch silicon oxide film 2 to expose a surface of silicon substrate 1 in element forming region B. In etching silicon oxide film 2, silicon oxide film 8 in element isolating trench region A also has its surface etched slightly.

Figure 8:
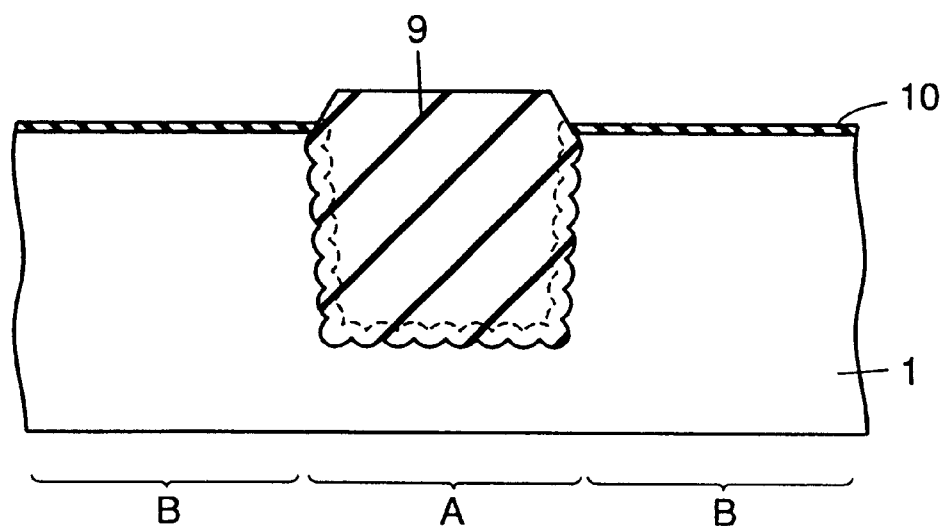
Figure 9:
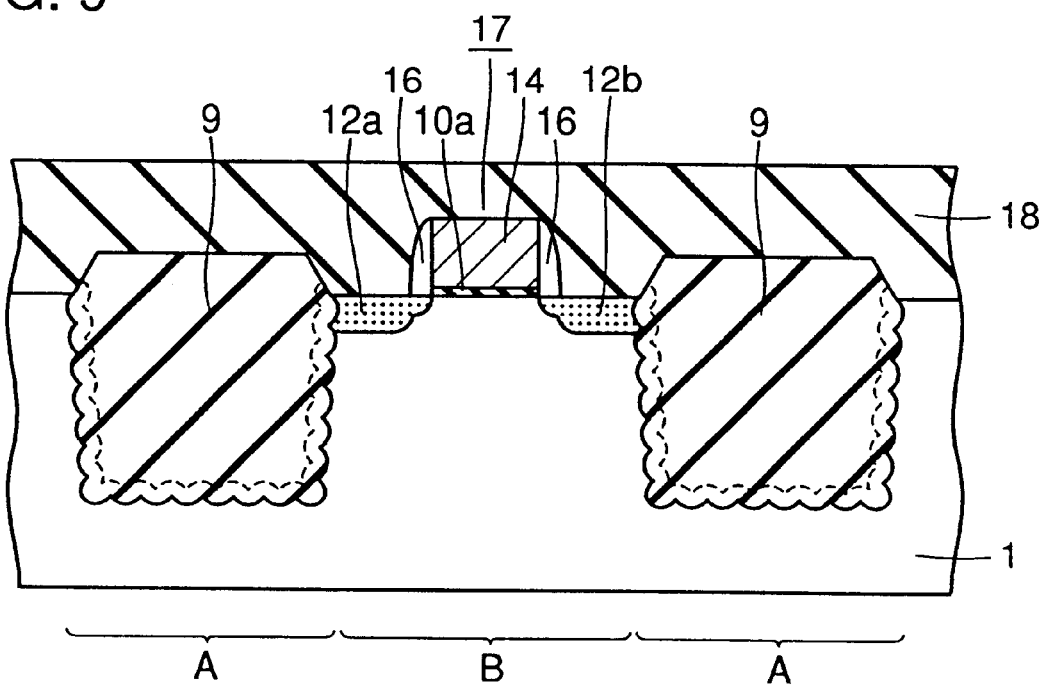
Figure 34:
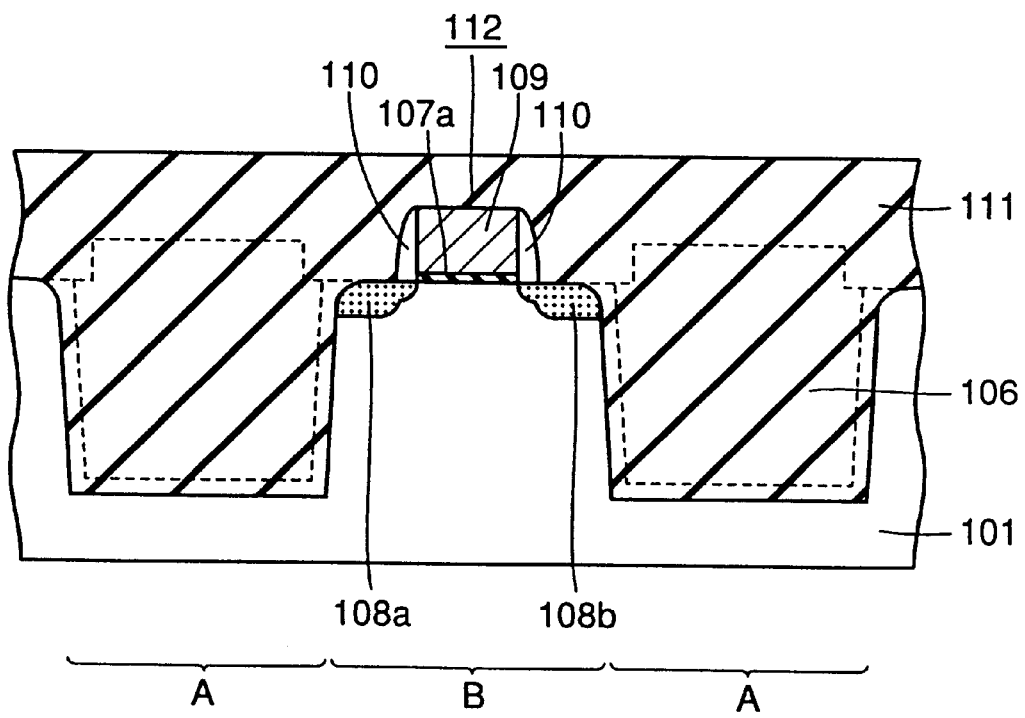
Figure 35:
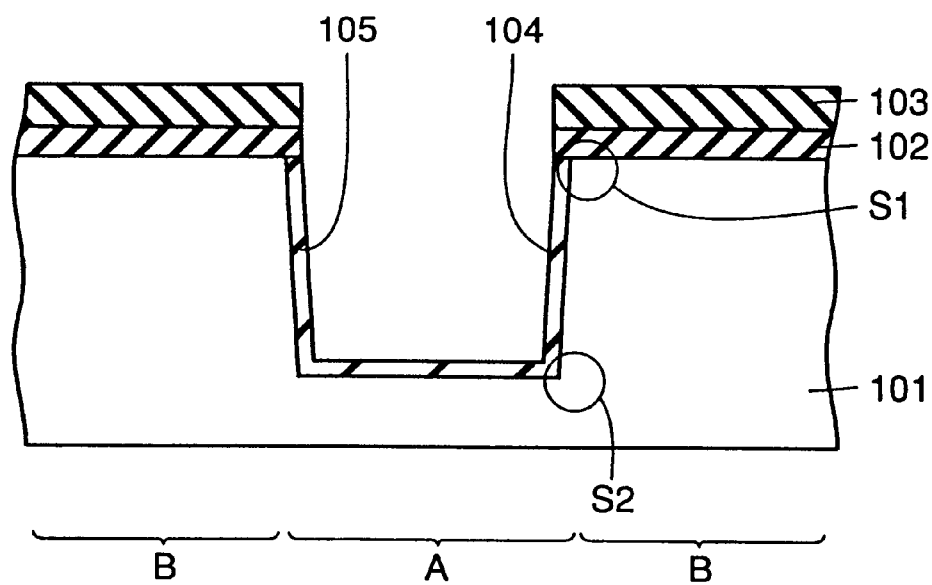
FIG. 35 is a cross section for illustrating a disadvantage of the conventional semiconductor device manufacturing method.

Referring then to FIG. 8, thermal oxidation or the like is employed to form a silicon oxide film 10 serving as a gate oxide film on silicon substrate 1. Referring then to FIG. 9, a step similar to the FIG. 34 step described in the Description of the Background Art is applied to form a gate electrode 14 in element forming region B on silicon substrate 1, with gate oxide film 10a posed therebetween. Sidewall insulating film 16 is formed on each of both side surfaces of gate electrode 14. Source/drain regions 12a, 12b are formed in surfaces of silicon substrate 1 such that they sandwich gate electrode 14 at its both sides. Thus one MOS transistor 17 is constructed, including gate electrode 14 and source/drain regions 12a and 12b. To cover MOS transistor 17, a silicon oxide film 18 is formed on silicon substrate 1. Thus a main portion of a semiconductor device provided with MOS transistor 17 completes.

Figure 10:
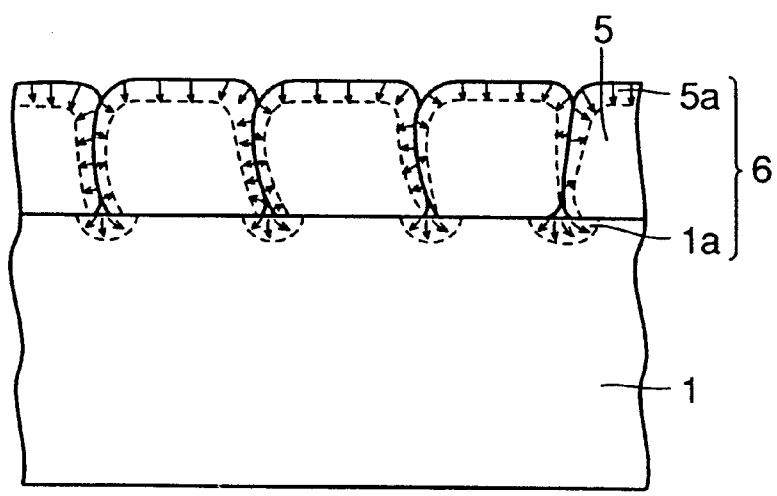
FIG. 10 is a partially enlarged cross section of the FIG. 3 step in the second embodiment of the present invention.

In accordance with the above manufacturing method, thermal oxidation is provided in the FIG. 3 step. In the thermal oxidation, polycrystalline silicon film 5 is oxidized gradually from its surface, as shown in FIG. 10, to form silicon oxide film 5a. the oxidation also proceeds at a grain boundary of polycrystalline silicon film 5. Thus, the oxidation in silicon substrate 1 located under polycrystalline silicon film 5 is faster at a portion located immediately under and close to the grain boundary. Thus, the portion of silicon substrate 1 immediately under and close to the grain boundary has a relatively deep silicon oxide film la, whereas that of silicon substrate 1 which is not located immediately under or dose to the grain boundary only has relatively shallow silicon oxide film 1a. Consequently, thermally oxidized silicon film 6 formed by silicon oxide films 5a, 1a and silicon substrate 1 has an uneven interface therebetween.

When polycrystalline silicon film 5 has a film thickness of less than 50 Å, there is not a significant difference between the oxidation proceeding from a grain boundary to silicon substrate 1 and the oxidation proceeding from a portion other than the grain boundary to silicon substrate 1. As a result, thermally oxidized silicon film 6 and silicon substrate 1 cannot have a sufficiently uneven interface therebetween.

When polycrystalline silicon film 5 has a film thickness of larger than 500 Å, it takes long time to thermally oxidize polycrystalline silicon film 5. It also takes longer time to form polycrystalline silicon film 5 itself. Thus productivity is degraded. Furthermore, the increased aspect ratio of the opening of trench 4 disadvantageously renders it difficult to fill trench 4 with silicon oxide film or the like in a subsequent step. For the reasons described above, it is preferable that polycrystalline silicon film 5 have a film thickness of 50 to 500 Å.

Figure 11:
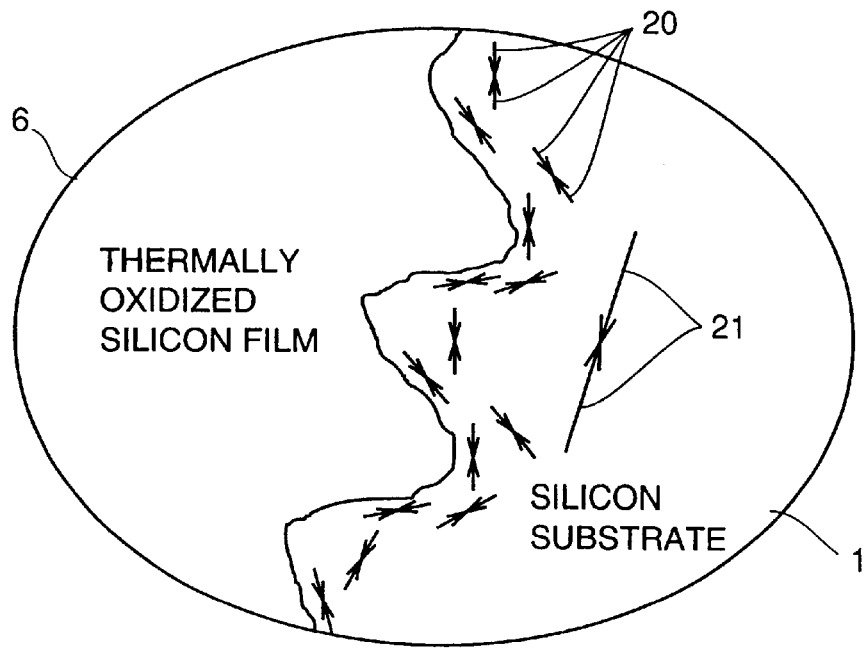
FIG. 11 is a schematic, partial cross section presenting a direction of a compressive stress caused in a silicon substrate in the FIG. 3 step of the second embodiment of the present invention.

A microscopic compressive stress 20 in silicon substrate 1 is caused along an interface. When thermally oxidized silicon film 6 and silicon substrate 1 has an uneven interface therebetween, microscopic compressive stress 20 is not exerted only in one direction, as shown in FIG. 11.

Figure 12:
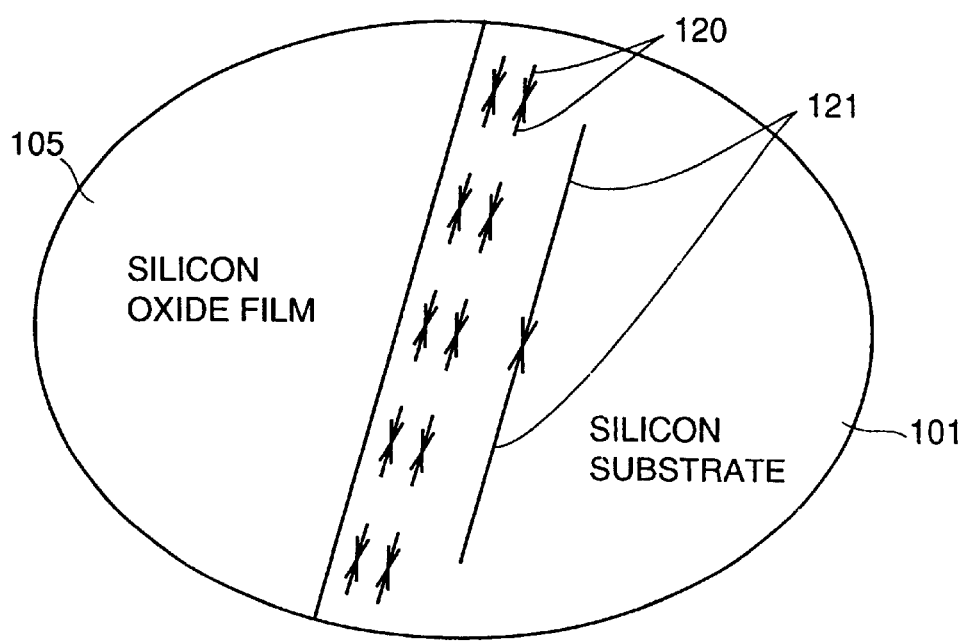
FIG. 12 is a schematic, partial cross section presenting a direction of a conventional compressive stress in the second embodiment of the present invention, for illustrating reduction of compressive stress.

In accordance with a conventional manufacturing method, silicon oxide film 105 and silicon substrate 101 do not have an uneven interface therebetween and a microscopic compressive stress 120 is exerted substantially in a single direction, as shown in FIG. 12. Thus a net compressive stress (a macroscopic compressive stress) 21 caused in silicon substrate 1 is smaller in magnitude than a net compressive stress 121 conventionally caused. Consequently, formation of crystal defect is minimized in silicon substrate 1 at regions T1 and T2, regions in silicon substrate 1 at which compressive stress in the silicon substrate 1 is exerted particularly intensively.

The reduction of crystal defect can enhance the electrical insulation between adjacent element forming regions Bs and reduce current leakage, as has been described in the first embodiment.

Third Embodiment

Figure 13:
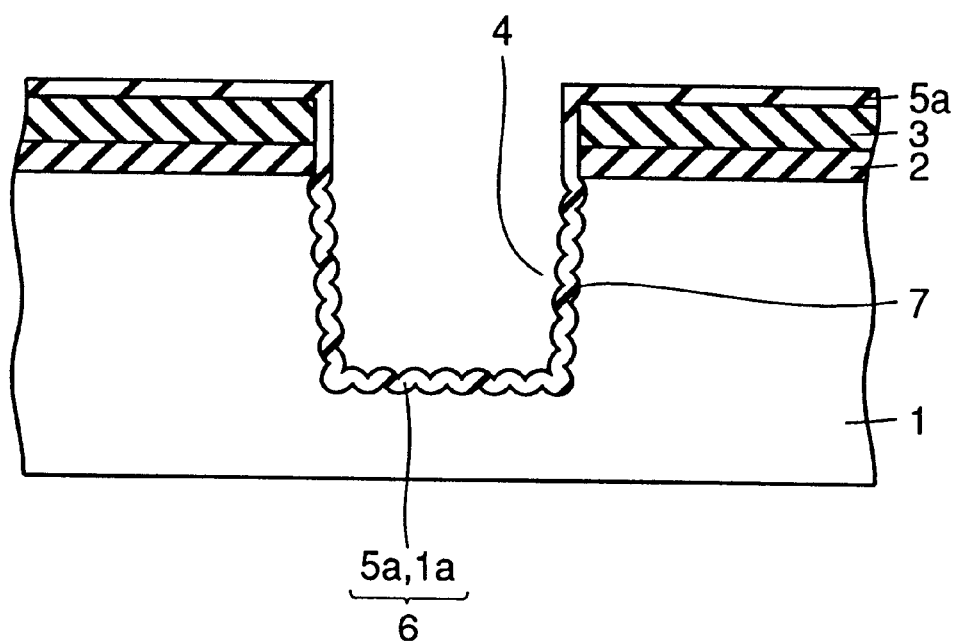
FIG. 13 is a cross section showing one process step of a semiconductor device manufacturing method according to a third embodiment of the present invention.
Figure 14:
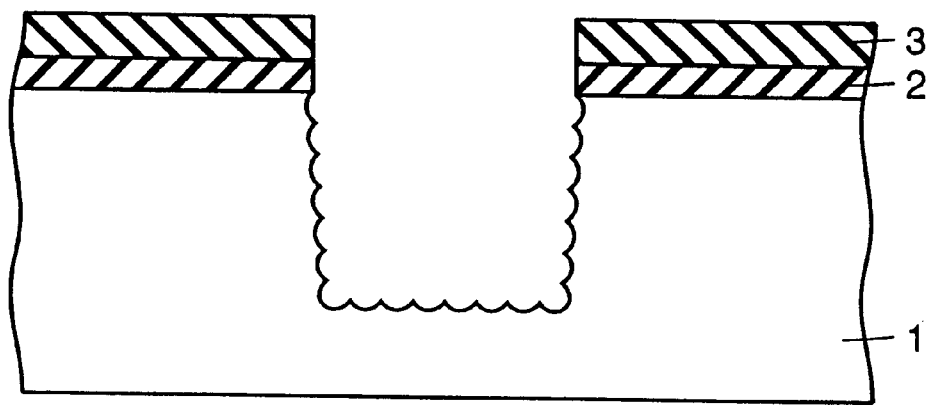
FIGS. 14–18 are cross sections showing a series of process steps according to the third embodiment of the present invention, each step performed after the step shown in the immediately preceding figure.

A semiconductor device manufacturing method according to a third embodiment of the present invention will now be described with reference to the drawings. The process up to the step shown in FIG. 13 is similar to the steps shown in FIGS. 2 and 3 described in the second embodiment. Referring then to FIG. 14, an aqueous solution of hydrofluoric acid or the like is used to remove silicon oxide film 5a formed by thermally oxidizing a polycrystalline silicon film and silicon oxide film 1a formed by thermally oxidizing silicon substrate 1. The removal of silicon oxide films 5a and 1a exposes an uneven surface of silicon substrate 1 in trench 4.

Figure 15:
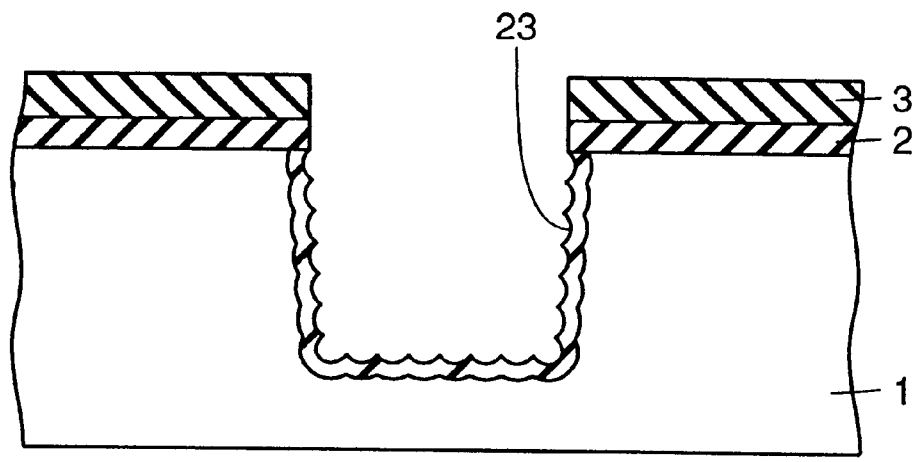
Figure 16:
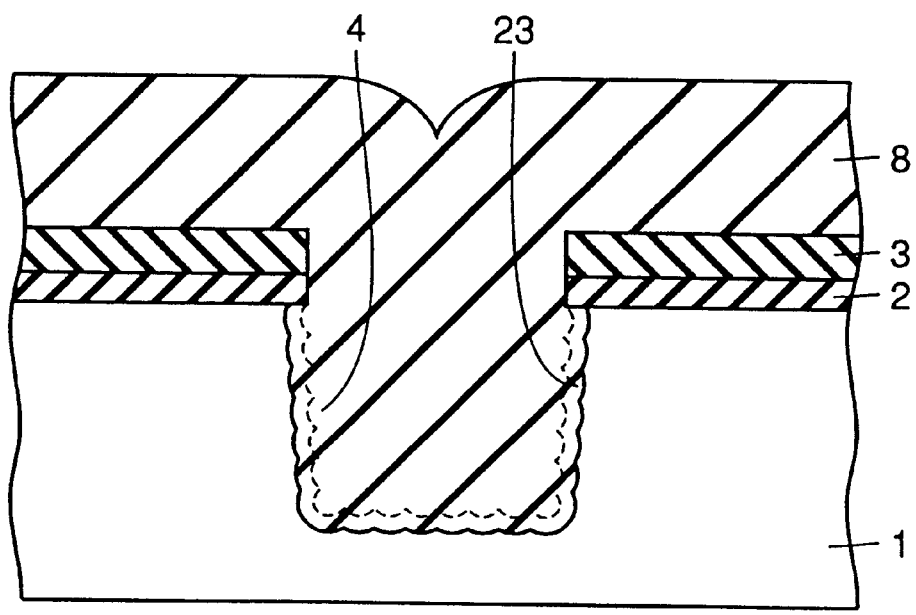
Figure 17:
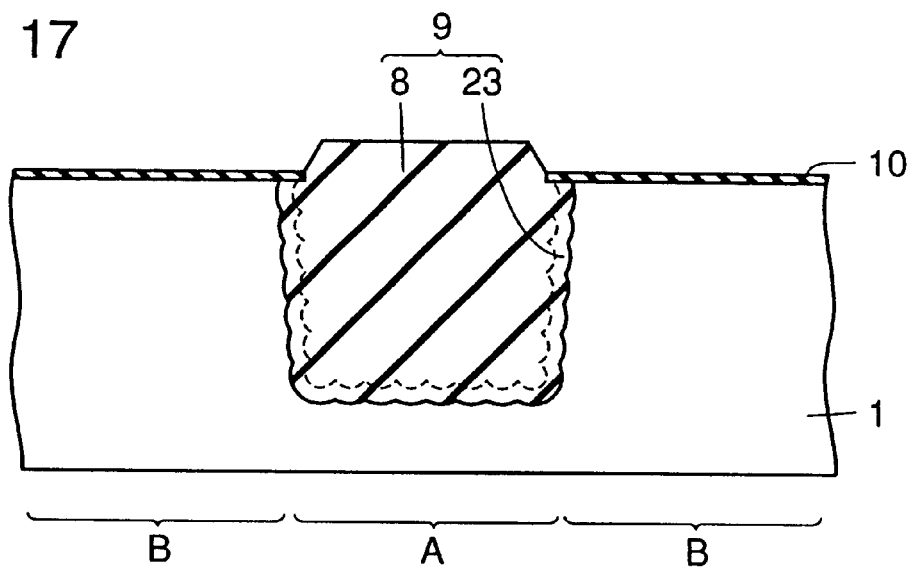
Figure 18:
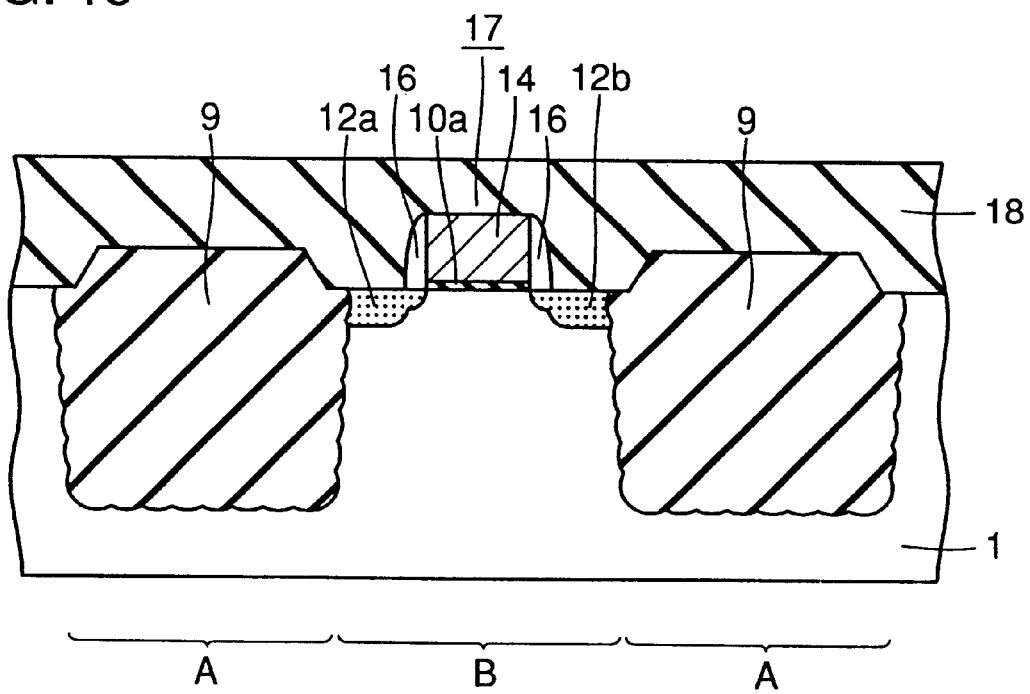

Referring then to FIG. 15, thermal oxidation is provided, e.g., at a temperature of 900 to 1100° C. in an oxygen ambient to oxidize the exposed uneven surface of silicon substrate 1 to form a silicon oxide film 23. Referring then to FIG. 16, to fill trench 4, chemical vapor deposition or the like is employed to form, e.g., TEOS-based silicon oxide film 8. Then steps similar to those shown in FIGS. 5–8 described in the second embodiment are applied to obtain the structure shown in FIG. 17. A step similar to that shown in FIG. 9 is also applied to complete a main portion of a semiconductor device with a MOS transistor 17 formed in element forming region B, as shown in FIG. 18.

Element forming region B is electrically isolated from other regions by element isolating trench region A. In particular, in element isolating trench region A formed as described above, element isolating oxide film 9 in a vicinity of interface 7 with silicon substrate 1 is formed by thermally oxidizing silicon substrate 1. Thus the silicon oxide film is more dense than that formed by thermally oxidizing a polycrystalline silicon film in the FIG. 9 semiconductor device according to the second embodiment. Thus, electrical insulation can further be enhanced between adjacent element forming regions Bs.

Fourth Embodiment

Figure 19:
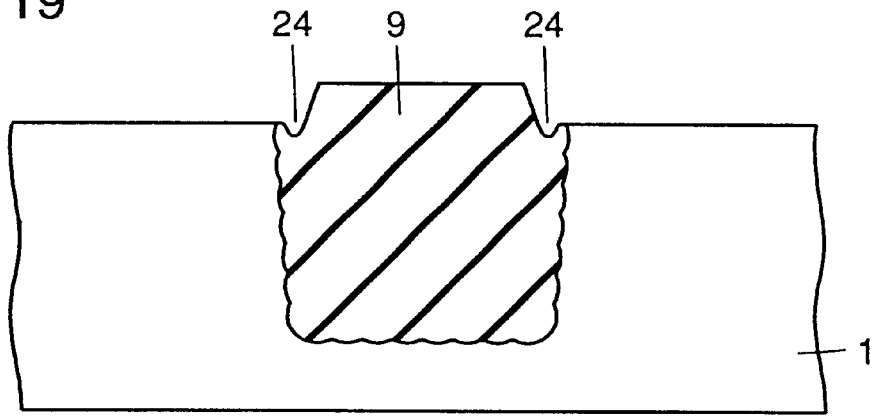
FIG. 19 is a cross section presenting a disadvantage of the semiconductor device manufacturing method according to the second embodiment.

In the FIG. 7 step described in the second embodiment, an end of element isolating oxide film 9 can be etched later due to an aqueous solution of fluoric acid and consequently a recessed portion 24 can result, as shown in FIG. 19.

When a MOS transistor or the like is formed in an element forming region with recessed portion 24 formed in element isolating oxide film 9 with therein, the relation between the drain current and gate voltage of the MOS transistor can deteriorate and a predetermined relation therebetween may not be presented. More specifically, for a gate voltage, the drain current can increase and thus exceed a predetermined value. This disadvantage can, however, be prevented by one example of a semiconductor device manufacturing method described in the present embodiment.

Figure 20:
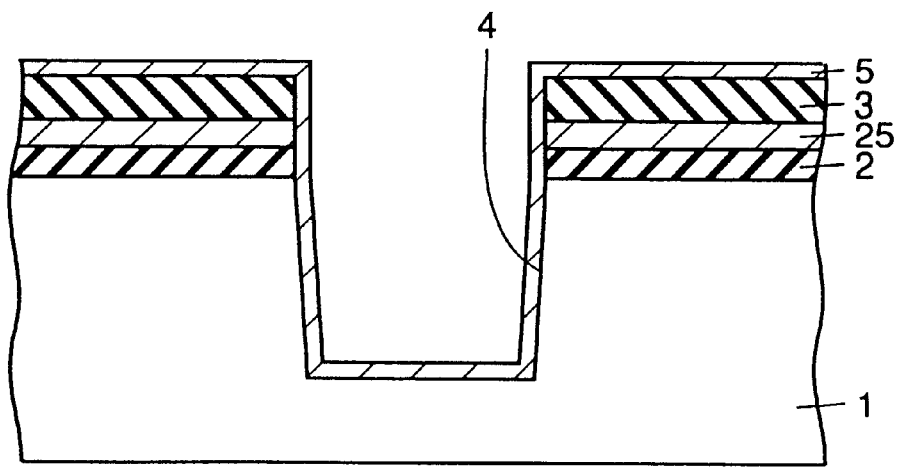
FIG. 20 is a cross section showing one process step of a semiconductor device manufacturing method according to a fourth embodiment of the present invention.

Referring first to FIG. 20, silicon oxide film 2 is initially formed on silicon substrate 1 and chemical vapor deposition or the like is then employed to form a polycrystalline silicon film 25. Then, as in the FIG. 2 step, silicon nitride film 3 is formed on polycrystalline silicon film 25 and trench 4 is then formed. Polycrystalline silicon film 5 is formed to cover trench 4.

Figure 21:
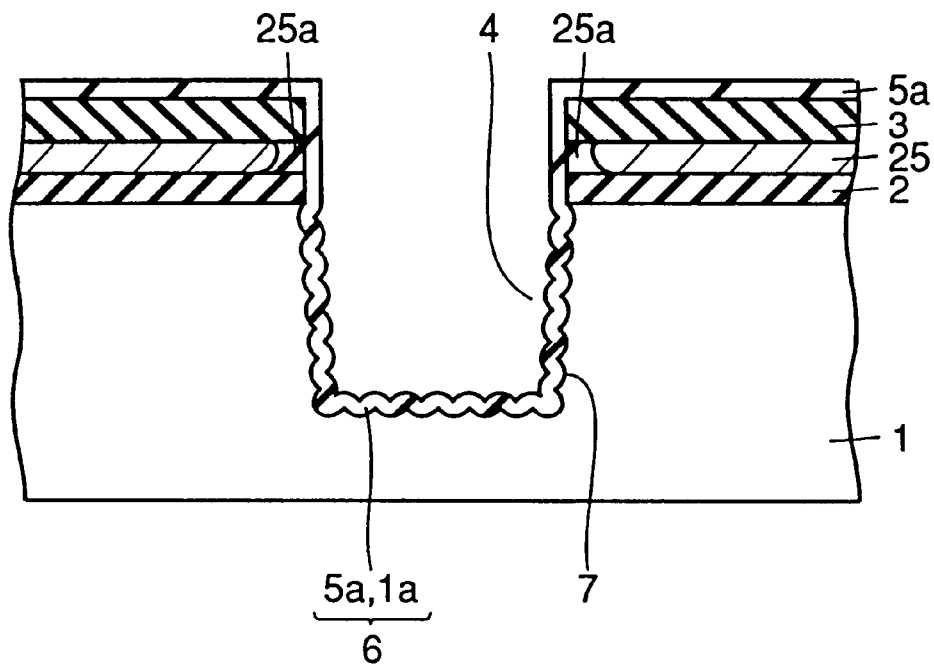
FIGS. 21–23 are cross sections showing a series of process steps according to the fourth embodiment of the present invention, each step performed after the step shown in the immediately preceding figure.

Referring then to FIG. 21, thermal oxidation is provided, e.g., at a temperature of 900 to 1100° C. in an oxygen ambient. The thermal oxidation provides an uneven interface 7 between thermally oxidized silicon film 6 and silicon substrate 1 and also partially oxidizes polycrystalline silicon film 25 in contact with polycrystalline silicon film 5 to form a silicon oxide film 25a. Due to a stress from silicon nitride film 3, that portion of polycrystalline silicon film 25 which is located closer to silicon oxide film 2 is oxidized more readily than that portion of polycrystalline silicon film 25 which is located closer to silicon nitride film 3.

Figure 22:
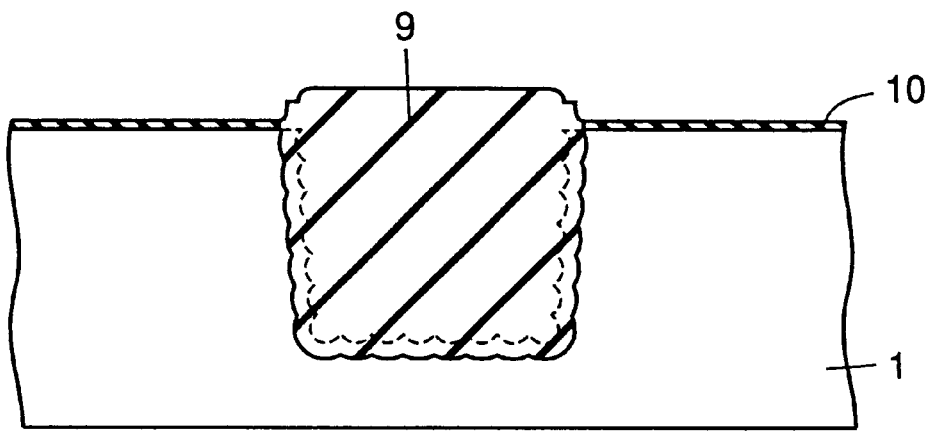

Steps similar to those shown in FIGS. 4–7 are then applied to obtain the structure shown in FIG. 22. In particular, in using an aqueous solution of hydrofluoric acid to remove silicon oxide film 2 to expose a surface of silicon substrate 1, the existence of silicon oxide film 25a prevents element isolating oxide film 9 from being etched excessively at an opening end of trench 4.

Figure 23:
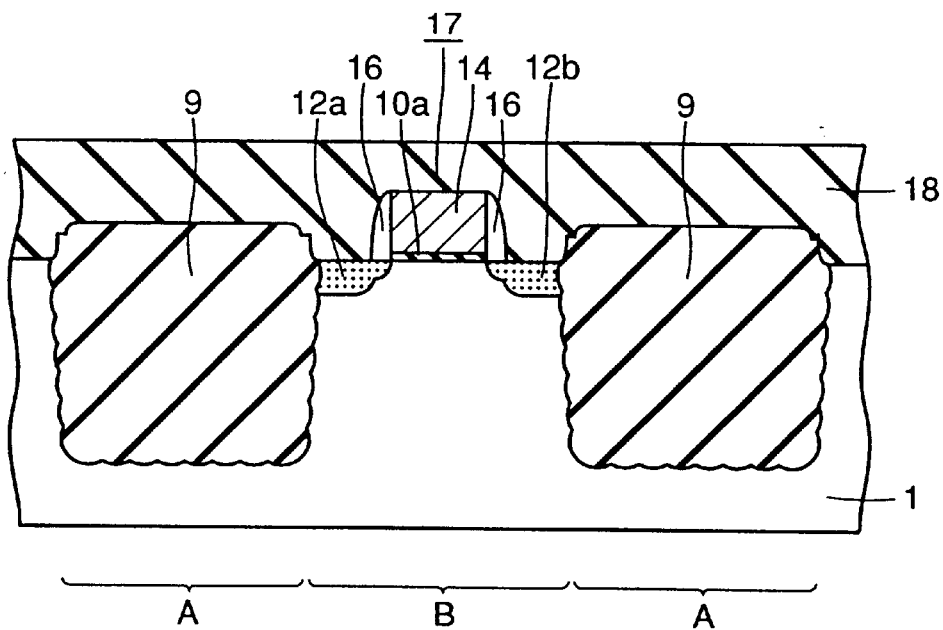

Then, MOS transistor 17 or the like is constructed on element forming region B, as shown in FIG. 23, to complete a main portion of a semiconductor device.

The semiconductor device formed as described above is free of the recessed portion formed at an end of element isolating oxide film 9 previously described in the present embodiment. Thus the semiconductor device can have a MOS transistor free of the disadvantage previously described in the present embodiment to obtain a predetermined relation between the drain current and gate voltage thereof.

Figure 24:
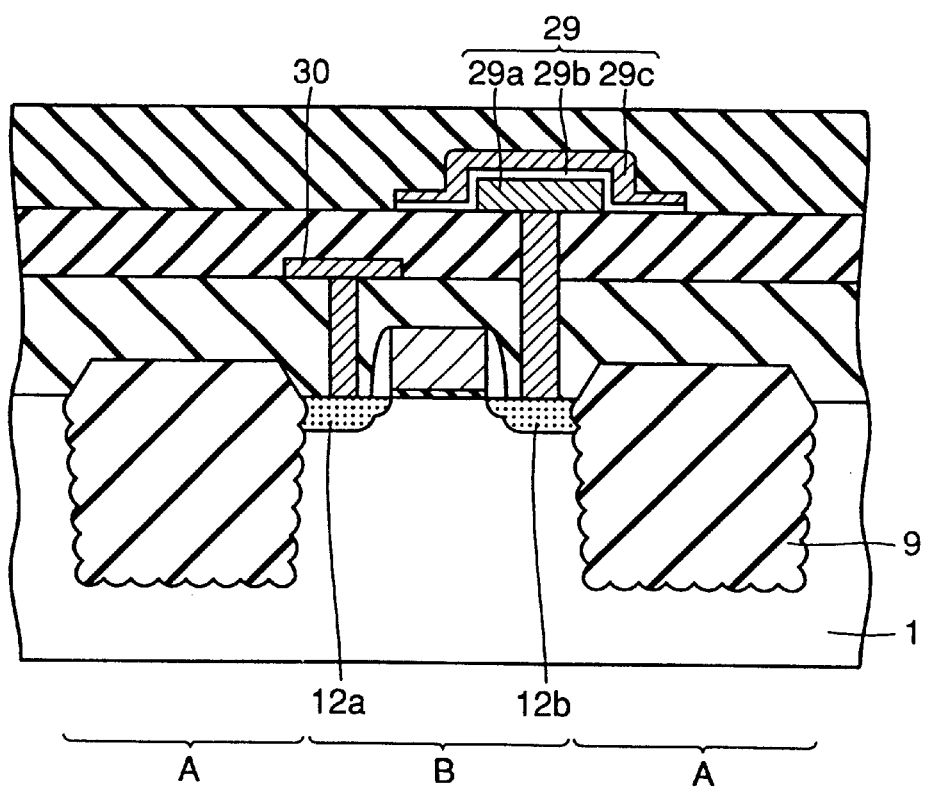
FIG. 24 is a cross section of another exemplary semiconductor device according to the present invention.

It should be noted that while in each of the above embodiments a MOS transistor is formed in element forming region B, a memory cell is additionally formed, as shown in FIG. 24, provided with a bit line 30 electrically connected to one source/drain region 12a of the MOS transistor, and a capacitor 29 having a storage node 29a, a capacitor dielectric film 29b and a cell plate 29c electrically connected to the other source/drain region 12b of the MOS transistor.

Figure 25:
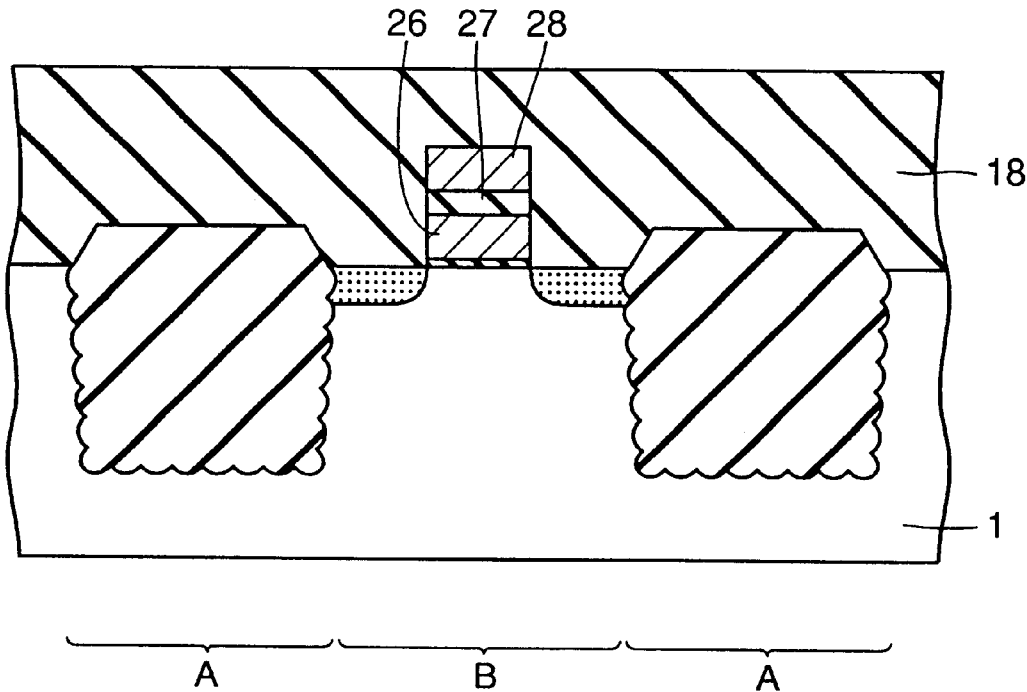
FIG. 25 is a cross section of still another exemplary semiconductor device according to the present invention.
Figure 26:
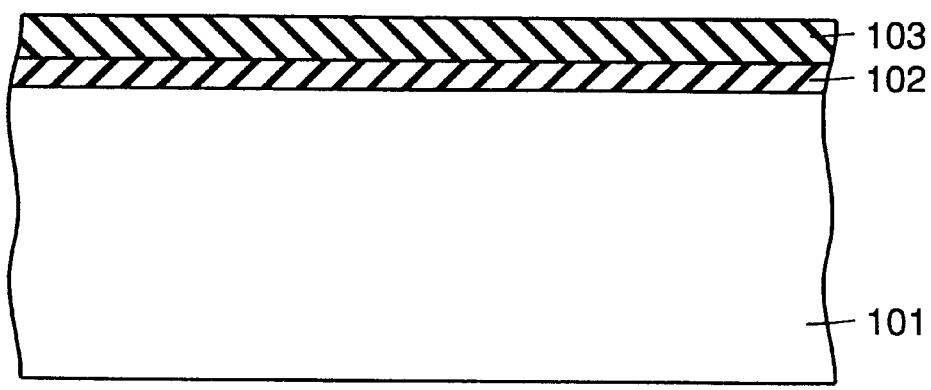
FIG. 26 is a cross section showing one process step of a conventional semiconductor device manufacturing method.

As shown in FIG. 25, a transistor may be formed, including a control gate electrode 28 deposited on a floating gate 26 with an ONO film 27 of silicon oxide film and silicon nitride film posed therebetween. Electrical insulation can be effectively enhanced between adjacent element forming regions Bs electrically isolated from each other by element isolating trench region A and each having the above-described element formed therein, and current leakage can also be reduced effectively.

While polycrystalline silicon film is formed on a silicon substrate in a trench in partially enhancing the thermal oxidation of the silicon substrate in the trench, amorphous silicon film can be alternatively formed to partially enhance the thermal oxidation of the silicon substrate in the trench.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device manufacturing method of forming an element isolating trench region electrically isolating an element forming region formed at a main surface of a silicon semiconductor substrate from another element forming region formed at a main surface of said semiconductor substrate; comprising:

the step of forming a trench in a main surface of said semiconductor substrate; and an interface formation step subjecting a main surface of said semiconductor substrate in said trench to a first thermal oxidation process to form a first oxide film and also partially enhancing thermal oxidation of a surface of said semiconductor substrate associated with said first thermal oxidation process to allow said first oxide film and said semiconductor substrate to have an uneven interface therebetween, wherein said interface formation step is followed by the steps of:

removing said first oxide film to expose an uneven surface of said semiconductor substrate in said trench; and subjecting said uneven surface of said semiconductor substrate to a second thermal oxidation process to form a second thermal oxide film.

2. The semiconductor device manufacturing method according to claim 1, wherein said interface formation step includes the steps of:

forming a grain boundary containing layer on a surface of said semiconductor substrate exposed in said trench; and subjecting said grain boundary containing layer to said first thermal oxidation process.

3. The semiconductor device manufacturing method according to claim 2, wherein said grain boundary containing layer is a polycrystalline silicon film having a film thickness of 50 to 500 Å.

4. The semiconductor device manufacturing method according to claim 1, wherein said interface formation step includes the step of forming said first oxide film containing a portion of said semiconductor substrate damaged when said trench is formed.

5. The semiconductor device manufacturing method according to claim 1, wherein:

said interface formation step is followed by the step of forming an insulating film on said semiconductor substrate to fill the trench and the step of polishing said insulating film to leave said insulating film in said trench; and the step of forming a first film on a main surface of said semiconductor substrate is provided before said trench is formed, said first film being different in polishing property from said insulating film.

6. The semiconductor device manufacturing method according to claim 5, comprising:

forming a second film between said first film and a main surface of said semiconductor substrate before said trench is formed, said second film becoming an oxide film when said second film is thermally oxidized; and said interface formation step is followed by the step of removing said first film and also removing said second film left unoxidized through said first or second thermal oxidation process while leaving said second film oxidized in a vicinity of an opening end of said trench through said first or second thermal oxidation process.

* * * * *